(12) United States Patent
Heissmeier et al.

(10) Patent No.: US 6,730,463 B2
(45) Date of Patent: May 4, 2004

(54) METHOD FOR DETERMINING AND REMOVING PHASE CONFLICTS ON ALTERNATING PHASE MASKS

(75) Inventors: Michael Heissmeier, München (DE); Markus Hofsäss, München (DE); Burkhard Ludwig, München (DE); Molela Moukara, München (DE); Christoph Nölscher, Nürnberg (DE)

(73) Assignee: Infineon Technologies AG, Munich (DE)

( * ) Notice: Subject to any disclaimer, the term of this patent is extended or adjusted under 35 U.S.C. 154(b) by 179 days.

(21) Appl. No.: 10/126,371

(22) Filed: Apr. 19, 2002

(65) Prior Publication Data

US 2002/0155362 A1 Oct. 24, 2002

(30) Foreign Application Priority Data

Apr. 19, 2001 (DE) .......................................... 101 19 145

(51) Int. Cl.[7] ............................... G03C 5/00; G03F 9/00
(52) U.S. Cl. ......................... 430/394; 430/396; 430/5; 716/19; 716/21; 378/35
(58) Field of Search ................................. 430/394–396, 430/5; 716/19–21; 378/35

(56) References Cited

U.S. PATENT DOCUMENTS

| 5,523,186 | A | 6/1996 | Lin et al. ........................ 430/5 |
| 5,523,198 | A | 6/1996 | Sakuma et al. ............. 430/509 |
| 5,537,648 | A | 7/1996 | Liebmann et al. .......... 395/500 |
| 5,923,566 | A | 7/1999 | Galan et al. ................. 364/489 |
| 6,277,527 | B1 | 8/2001 | O'Grady et al. ................ 430/5 |
| 6,518,180 | B1 * | 2/2003 | Fukuda ........................ 438/671 |
| 6,543,045 | B2 * | 4/2003 | Ludwig et al. ................ 716/21 |

FOREIGN PATENT DOCUMENTS

| JP | 2000 338 637 | 12/2000 |
| JP | 2000 338 647 A | 12/2000 |
| WO | WO 01/06320 A1 | 1/2001 |

* cited by examiner

*Primary Examiner*—Mark F. Huff
*Assistant Examiner*—Daborah Chacko-Davis
(74) *Attorney, Agent, or Firm*—Laurence A. Greenberg; Werner H. Stemer; Gregory L. Mayback (57) ABSTRACT

A photoresist layer on a substrate wafer is exposed in first sections with a first exposure radiation and in second sections with a second exposure radiation that is phase-shifted by 180°. The first and second sections adjoin one another in boundary regions in which the photoresist layer is artificially not sufficiently exposed. Where a distance between these boundary regions is smaller than a photolithographically critical, least distance, the photoresist layer is exposed, at a first boundary region, with a third exposure radiation and at a second boundary region with a fourth exposure radiation phase-shifted by 180°. A trim mask provided for the process has a first translucent region and a second translucent region. The first light-transparent region and the second light-transparent region are fashioned such that the light passing through the first light-transparent region and the light passing through the second light-transparent region has a phase displacement of 180°.

5 Claims, 4 Drawing Sheets

METHOD FOR DETERMINING AND REMOVING PHASE CONFLICTS ON ALTERNATING PHASE MASKS

BACKGROUND OF THE INVENTION

Field of the Invention

The invention relates generally to the field of manufacturing integrated semiconductor circuits, such as VLSI and ULSI circuits, using photolithographic methods. In particular, the invention relates to the increase of the resolution capacity of conventional photolithography through the use of alternating phase masks.

In the manufacturing of integrated semiconductor circuits, the mask structures allocated to the circuit elements are optically imaged on light-sensitive layers on the wafer in a conventional manner. Due to the diffraction effect, the resolution capacity of such an imaging system is limited, and mask structures having dimensions below the reciprocal value of this resolution capacity, called the critical structures, are imaged in blurred or unfocused fashion. This leads to undesired strong correlations of the circuit elements, and thus to an adverse effect on the circuit functionality.

These difficulties can be overcome by exploiting the destructive interference effect of two closely adjacent and coherent light beams that are phase-displaced by 180°, and converting the conventional masks concerned into alternating phase masks, in which each critical structure is provided with two phase shifters in order to produce the required phase displacement.

The various types of phase masks are for example described in the book "Technologie hochintegrieter Schaltungen," by Widmann, Mader, and Friedrich, 2nd ed., Springer-Verlag, pp. 135ff. A detailed overview of phase mask technology is contained in the publications "Improving Resolution in Photolithography with a Phase-Shifting Mask," by M. D. Levenson et al., in IEEE Trans. Electron. Devices 29 (1982), 1828ff., and "Wavefront Engineering for Photolithography," by M. D. Levenson 993, in Physics Today, Jul. 1993, p. 28ff.

The use of so-called strong phase masks, including both the already-mentioned alternating phase masks and also phase masks without chromium, requires that in each affected level, the transparent phase-shifting structures are assigned to one of two phases, having a phase difference $\Delta\Phi=180°$. Here the following two cases must be distinguished. In what is known as a dark-field phase mask, transparent structures correspond to the circuit elements (e.g., printed conductors), and phases can be assigned to them, while opaque mask fields are formed by regions covered with chromium. In contrast, in a so-called bright-field phase mask the opaque regions, covered with chromium, of the phase masks represent the circuit elements, and the regions situated between them are transparent. In the latter case, suitable regions in the vicinity of the opaque chromium regions must be designated as phase-shifting elements. The creation of the phase-shifting elements takes place according to particular design rules known from the prior art, and is described for example in U.S. Pat. No. 5,537,648.

However, in view of the complexity of modern circuits, and the requirement of two elements that are phase-displaced by 180° to one another at each critical structure, phase conflicts are conceivable. A phase conflict is present precisely when the phase shifters on both sides of a critical structure are erroneously assigned the same phase, or when, due to the interaction of the phase-shifting elements, the destructive interference effect occurs at an undesired location on the already-mentioned light-sensitive layer. The phase assignment for the different phase-shifting elements thus represents a mathematical-combinatorial problem that does not have a general solution. Because in principle the phase assignment can lead to different results, and different phase assignments can occur for one and the same cell of a hierarchical layout, the phase assignment in an automated program must finally be carried out at the finished circuit layout. An automated checking routine is therefore required that examines a circuit layout in order to see whether a phase assignment is possible at all. This check should be complete, and should localize the problem point as well as possible, i.e., should determine its actual point of origin. The latter is not self-evident, because the location at which it is discovered that the combinatorial problem does not "work out" may be located far from the actual point of origin.

After phase conflicts have been determined in an automated routine, they can be resolved in two fundamentally different ways. First, the circuit design can be modified slightly at the locations of the localized phase conflicts, for example by displacing printed conductor structures, so that the phase conflicts are removed. On the basis of this modified circuit design, a successful phase assignment can then be carried out in order to create a phase mask. However, this method is avoided whenever possible, because it is not in accord with the miniaturization process, governed by Moore's Law, in microelectronics.

Second, the circuit design can remain unmodified, and instead phase conflicts can be solved by assigning two different phases to individual phase-shifting elements. However, this has the consequence that during exposure a dark region occurs at the boundary line between the two different phase regions, which would lead to an interruption. For this reason, in this case an additional exposure step must be carried out using what is called a trim mask, by means of which the occurrent dark boundary regions are separately exposed at a later time. However, in such a subsequent exposure using a trim mask, there is then in turn the danger that, if the dimensions of the trim mask structure are below the reciprocal value of this resolution capacity of the exposure system, these photolithographically critical structures will be imaged in blurred or unfocused fashion, which can lead to an adverse effect on the functionality of the integrated semiconductor circuits.

In the prior art, various methods are known for testing a layout for phase conflicts. In the publication "Heuristic Method for Phase-Conflict Minimization in Automatic Phase-Shift Mask Design," by A. Moniwa et al., in Jpn. J. Appl. Phys., vol. 34 (1995), pp. 6584–89, a graph-theoretical approach is described in which a set of phase-shifted elements is assumed, and from this set a planar undirected graph is formed, taking into account the technological requirements. In addition, U.S. Pat. No. 5,923,566 describes a computer-implemented routine that verifies whether an existing circuit design can be imaged onto a phase mask, or whether localized phase conflicts are present. However, neither of the methods described above works optimally in the acquisition of phase conflicts. First of all, both these methods prove to be inefficient, because in them for example certain phase conflicts are indicated twice. Second, they prove to be inadequate, because with them certain other phase conflicts cannot be acquired. In addition, in the cited references such phase conflicts are not resolved, and moreover the problem is also not addressed of an insufficient subsequent exposure of dark boundary regions with the known trim mask structures.

U.S. Pat. No. 5,523,198 describes a method in which boundary sections that were not sufficiently exposed in a first exposure step using a phase mask are subsequently exposed in a second step using a pure light-dark mask. In addition, a method is described in which, in two successive exposure steps, phase masks and a trim mask are used. Such trim masks are additionally known from the international PCT publication WO 2001/06320 A1 and from Japanese patent application JP 2000-338637 A.

SUMMARY OF THE INVENTION

It is accordingly an object of the invention to provide an improved method for determining possible phase conflicts on alternating phase masks, which overcomes the above-mentioned disadvantages of the heretofore-known devices and methods of this general type and which allows for the automatic removal of these phase conflicts. It is a further object to provide a trim mask with which an exposure is ensured even of photolithographically critical dark structures.

With the foregoing and other objects in view there is provided, in accordance with the invention, a method for exposing a photoresist layer on a substrate wafer, which comprises the following method steps:

in a first exposure step, exposing the photoresist layer in first sections with a first exposure radiation and in second sections with a second exposure radiation, the first exposure radiation being phase-displaced by 180° relative to the second exposure radiation, and the first and second sections adjoining one another in boundary regions that are not sufficiently exposed;

determining first and second boundary regions respectively having less than a given predetermined least distance from one another; and in a second exposure step, reexposing the photoresist layer in the first boundary region with a third exposure radiation, and in the second boundary region with a fourth exposure radiation, the third exposure radiation being phase-displaced by 180° relative to the fourth exposure radiation.

In other words, the objects of the invention are achieved with the inventive method for exposing a photoresist layer on a substrate wafer in which, in a first exposure step in which the photoresist layer is exposed in a first section with a first radiation and in a second section with a second exposure radiation, whereby there is a phase displacement of 180° between the first exposure radiation and the second exposure radiation. The first and second sections thereby adjoin one another in boundary regions that are not sufficiently exposed in the first exposure step. After the determination of first and second boundary regions each having less than a particular predetermined least distance, i.e., photolithographically critical distance, from one another, in a second exposure step a subsequent exposure of the photoresist layer is then carried out in the first boundary region with a third exposure radiation, and is carried out in the second boundary region with a fourth exposure radiation, there being a phase displacement of 180° between the third exposure radiation and the fourth exposure radiation. The remaining boundary regions can here be exposed with a further exposure radiation having arbitrary phase.

The advantage of the invention is that after the use of a phase mask even after the second exposure step, there remain no regions in the photoresist layer that are exposed in defective fashion due to diffraction effects. Defectively exposed regions in the second exposure step occur when two boundary regions that are to be subsequently exposed have a distance from one another that is so small in relation to the wavelength of the exposure radiation that undesirable diffraction effects occur during imaging.

Such diffraction effects occur in a conventional trim mask having structural dimensions that are smaller than the reciprocal value of the resolution capacity in the imaging, because in this case these photolithographically critical structures are imaged in blurred or unfocused fashion. This can lead to undesired strong correlations of the circuit elements, and thus to an adverse effect on the circuit functionality. In order to avoid this, according to the invention a phase shifting of the exposure radiation is provided also in the second exposure step, so that with the aid of the destructive interference effect, which is already exploited for the imaging of structures in the first exposure step, a defective exposure of the boundary regions that are to be subsequently exposed can be avoided. With the trim mask, fashioned as an alternating phase mask, through the destructive interference effect of the third and fourth exposure radiation with opposite phases all photolithographically critical structures at the boundary regions that are to be subsequently exposed are correctly imaged.

Advantageously, the exposure steps are carried out with the aid of a phase mask, the phase mask having regions that are transparent to light, which assigns a particular phase shift to the light passing through.

According to a preferred specific embodiment, if the inventive method is to be applied in a dark-field phase mask technology, the mask for the first and/or second exposure step is determined as follows:

In a first method step, critical regions are determined in which two adjacent, transparent regions provided for the phase mask have less than a particular predetermined least distance from one another.

In a second method step, overlapping regions are determined between rectilinear segments of the obtained critical regions and end regions of rectilinear segments, ending in the middle of transparent regions, of the critical regions, and degenerate critical regions are generated. The latter are obtained by subtracting overlapping regions from the critical regions.

In a third method step, coherent regions ("countries") located outside the transparent regions and outside the critical regions are then determined, as are large outer borders of the countries and of the overlapping regions and end regions obtained in the previous method step.

Then, in a fourth method step, from each of the determined outer borders the number of segments of contact with the degenerate critical regions is determined, and, if the number is odd, a phase conflict is determined.

Finally, in a fifth method step, the phase conflicts are resolved by determining coherent layout regions and the region borders thereof, coherent layout regions being defined by the transparent regions and the critical regions located between them minus overlapping regions representing the end regions and the phase conflicts, and at least one connection path being produced between an outer border representing a phase conflict and either a nearest additional outer region border or an odd number of not-yet-connected large outer borders, which likewise represent phase conflicts; then the quantity of produced connection paths is reduced to those in which each phase conflict is contained exactly once, and then those regions (covering regions) of the connection paths are marked that are located over the transparent regions, and finally, for the phase mask the covering regions are fashioned as boundaries between two different regions of the phase mask to be manufactured, whose phase displacements have a phase difference of $\Delta\Phi=180°$.

According to a preferred specific embodiment, if the inventive method is to be applied in a bright-field phase mask technology, the mask for the first and/or for the second exposure step is determined as follows:

In a first method step, phase-shifting regions are respectively determined on both sides of opaque critical regions provided for the phase mask. Critical regions are defined in that they have less than a predetermined structural width.

Next, in a second method step overlapping regions are generated between rectilinear segments of the critical regions and end regions of rectilinear segments, ending in the middle of phase-shifting regions or regions of interaction between phase-shifting regions, of the critical regions, and degenerate critical regions are generated. The latter are obtained by subtracting overlapping regions from the critical regions.

In a third method step, coherent regions (countries) located outside the phase-shifting regions, regions of interaction, and critical regions, are determined, as are large outer borders of these countries, and of the overlapping regions and end regions obtained in the previous method step.

Finally, in a fourth method step, from each of the determined outer borders the number of segments of contact with the degenerate critical regions is determined, and if the number is odd, a phase conflict is determined.

In a fifth method step, the phase conflicts are then resolved in that coherent layout regions and the borders thereof are determined, coherent layout regions being defined through the phase-shifting regions, the critical regions, and the regions of interaction minus regions of overlap representing the end regions and the phase conflicts, and at least one connection path being produced between a large outer border representing a phase conflict and either a nearest additional external region border or an odd number of not-yet-connected large outer borders, which likewise represent phase conflicts; then the quantity of produced connection paths is reduced to those in which each phase conflict is contained exactly once, and then those regions (covering regions) of the connection paths are marked that are located over the transparent phase-shifting regions, and, finally, for the phase mask the covering regions are fashioned as region boundaries between two different regions of the phase mask to be manufactured, whose phase displacements have a phase difference of $\Delta\Phi=180°$.

According to the two inventive developments presented above, in a first step thereof a formalism is thus provided by means of which the direct convertibility of integrated semiconductor circuits into alternating phase masks B both dark-field and bright-field phase masks B is tested. This takes place through an explicit localization of the phase conflicts occurring in the corresponding layout, with the application only of the technical demands placed on the design. The set of phase conflicts determined with the aid of this formalism is complete and minimal, i.e., all existing phase conflicts are always determined, and existing phase conflicts are not indicated more than once.

Subsequently, the phase conflicts are removed through the described automated method. In the removal of the phase conflicts, both in dark-field and also in bright-field technology the connection paths are formed practically and rapidly in such a way that at first pairs of opposite edges of a respective large outer border and of an adjacent outer region border are determined, and subsequently at least one connection path is produced between the edges of each pair.

Since, however, the connection paths must later lead to phase jumps, i.e., sudden phase changes in the phase-shifting regions, in the group-by-group solution of the associated neighborhood problem only those edges are to be taken into account that are to be allocated to the large outer contour of the respective layout group and to the polygons representing phase conflicts, from which the contact segments are to be subtracted.

However, the connection paths do not necessarily run between edges of pairs of large outer borders representing the phase conflict and the layout group borders. Moreover, a connection path between two phase conflicts, or between a phase conflict and the outer contour of a layout group, need not necessarily be even; rather, it can run through countries having an even number of contact segments (i.e., no phase conflicts), and can assume a very complicated form. Its essential feature is that it connects a phase conflict with the additional external outer contour of its layout group, or connects two phase conflicts with one another.

After the production of the connection paths, these are reduced to a quantity of connection paths in which each phase conflict occurs only once. For the inventive removal of the phase conflicts, it is thus sufficient respectively to retain only one connection path between two phase conflicts, or between a phase conflict and the outer contour of its layout group, after the reduction.

Subsequently, those regions of the connection paths that are located over the phase-shifting regions are taken into account or are marked in some way. Then, for the preparation for the manufacture of the first phase mask, the covering regions are formed as boundaries between two different regions of the phase mask to be manufactured. For this purpose, for example the covering regions can be subtracted from the phase shifters, and the regions of the first phase mask to be manufactured can be represented in a suitable matter, e.g., as two different colors of a two-color phase mask. The present invention describes a double exposure technique for the automatic handling of arbitrary layouts in phase mask technology. The mask for the second exposure process is thereby likewise a phase mask. This enables the handling of propagating phase conflicts. The second phase mask is automatically generated from the phase-shifting elements, the structures, and the connection paths between the borders, calculated using the above-explained formalism, for the automatic removal of phase conflicts.

In addition, according to the invention a trim mask is provided for use in the above-named method, with which a photoresist layer is exposed in a second exposure step after an exposure with a phase mask. The trim mask has a first region transparent to light and a second region transparent to light, in order subsequently to expose the regions in the photoresist layer that were artificially unexposed through the use of the phase mask in the first exposure step. The first light-transparent region and the second light-transparent region are formed such that the phase displacement of 180° is obtained between the third exposure radiation, passing through the first transparent region, and the fourth exposure radiation, passing through the second transparent region. The isolated trim openings can be exposed with an additional exposure radiation having arbitrary phase. This trim mask has the advantage that it is suitable for the subsequent exposure of two regions on the photoresist layer that were artificially not exposed in a first exposure step. In particular in the propagation of phase conflicts, it happens that the artificially unexposed regions are located on both sides of a critical structure, and thus have a spacing that is too small for a precise imaging using conventional masking technology. Given a conventional trim mask, one would thus obtain a defective exposure between the subsequently exposed regions. In contrast, the inventive trim mask has the advantage that, due to the destructive interference effect in the exposure of the artificially exposed regions in the second exposure step, it enables an exact imaging of the critical structure. The correction of the interferences through the boundary regions between the phase-shifting regions of the phase mask of the first exposure step thus does not have the result that the structure to be imaged is represented in unfocused fashion due to diffraction effects, or is destroyed by the second exposure step.

Advantageously, only those regions are provided with a 180° phase displacement that relate to photolithographically critical structures, while all uncritical structures are exposed with the aid of a transparent region, without a fixedly predetermined phase displacement.

In the context of bright-field phase mask technology, a trim mask is thereby preferably used that consists of trim structures, a dark region, and an associated bright background, the trim structures being colored in such a way that those trim structures located at critical structures overlapped by connection paths receive opposed phases for the exposure radiation, whereby a phase displacement of 90° to the bright background is maintained.

For application in the context of dark-field phase mask technology, the trim mask preferably consists of trim structures, a bright region, and an associated dark background, the trim structures being colored in such a way that those trim structures located at critical structures overlapped by connection paths receive opposed phases for the exposure radiation.

The trim structures are thereby determined, both in bright-field and also in dark-field phase mask technology, by parallel expansion along the phase shifters of the above-determined covering regions.

The two exposure masks in bright-field or dark-field phase mask technology can be divided into the following regions: critical structures (KR); uncritical structures (UKR); undecomposed phase shifters (PO); connection paths (VW) from the automatic removal of phase conflicts; segments (VWPO) of the connection paths over the undecomposed phase shifters (PO); segments (VWKR) of the connection paths over the critical structures (KR); artificially decomposed phase shifters (PZ) that correspond to the undecomposed phase shifters (PO) minus segments (VWPO) of the connection paths over the undecomposed phase shifters (PO); trim structures (TS) that are determined by extending the segments (VWPO) of the connection paths over the undecomposed phase shifters (PO) parallel to the undecomposed phase shifters (PO) to the left and to the right by a predetermined length, called the trim width; and regions (TBG) composed from undecomposed phase shifters (PO), critical structures (KR), uncritical structures (UKR) minus the trim structures (TS).

In addition, the multiply coherent region outside the phase shifters and additional structures is designated the background, whereby it is not distinguished whether these structures are photolithographically critical or uncritical. In bright-field technology, this background is bright, and in dark-field technology it is dark.

The two exposure masks, i.e., the phase mask (M1) for the first exposure step and the trim mask (M2), are automatically determined, according to the method presented above, as follows:

In dark-field phase mask technology, phase mask (M1) is made up of a two-colored set of artificially decomposed phase shifters (PZ) and the associated dark background. Trim mask (M2) for the subsequent exposure of artificially produced dark regions on the photoresist consists of a two-colored set of trim structures (TS), regions transparent to light in the uncritical structures (UKR.), and the associated dark background.

In bright-field phase mask technology, phase mask (M1) is made up of a two-colored set of artificially decomposed phase shifters (PZ) and the associated bright background. Trim mask (M2), for the subsequent exposure of artificially produced dark regions on the photoresist, consists of a two-colored set of trim structures (TS), dark composed regions (TBG) representing the undecomposed phase shifters (PO), the critical structures (KR), and the uncritical structures (UKR) minus the trim structures (TS), and the associated bright background, having a 90° phase difference from the trim structures (TS)

Trim structures are thereby always colored such that two trim structures on a segment (VWKR) of the connection path over the critical structures (KR) receive opposed phases. All other trim structures can be exposed with an arbitrary phase. This holds also for regions transparent to light on the uncritical structures (UKR). However, a matching to one of the phases in the colored trim structure region is preferably carried out. If this trim structure region has for example a 90°/270° coloring, then 90° or 270° phase is selected for the remaining trim structures and regions transparent to light at uncritical structures. In addition, in trim structure coloration in bright-field phase mask technology, a 90° phase difference to the bright background is maintained, because given a 90° phase difference the light intensity lies above the threshold of sensitivity of the photoresist, so that unexposed regions do not occur on the edge of composed regions (TBG). If, for example, 90°/270° coloration is used for the trim structures, a 180° phase is assigned to the bright background.

Other features which are considered as characteristic for the invention are set forth in the appended claims.

Although the invention is illustrated and described herein as embodied in a method for determining and removing phase conflicts on alternating phase masks, and mask configuration for use with such a method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
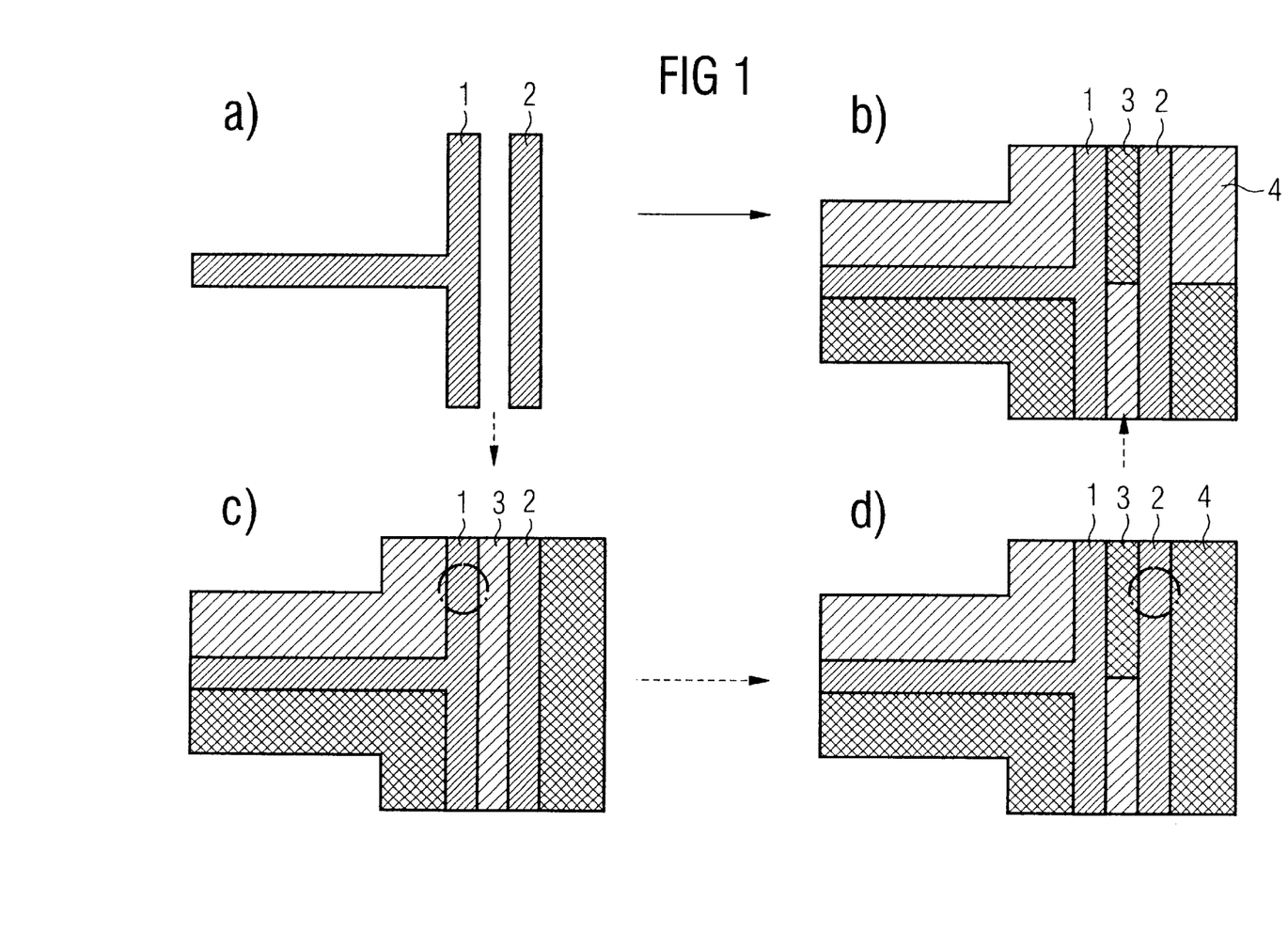
FIG. 1 shows, in four diagrammatic views a)–d), the occurrence of propagating phase conflicts in a bright-field phase mask technology, for the example of a T-printed conductor structure.

Referring now to the figures of the drawing in detail and first, particularly, to FIG. 1 thereof, there is shown the occurrence of phase conflict regions in bright-field phase mask technology. In bright-field phase mask technology, circuit structures are represented by regions on the mask that are opaque to light. All other regions are transparent.

In FIG. 1a, as an example a conductor structure is shown that is manufactured with the aid of bright-field phase mask technology. The conductor structure has a T-shaped conductor piece 1, and a rectilinear conductor piece 2 situated over the T-bar of the T-shaped conductor piece. The conductor pieces have a width that is small enough that they cannot be imaged with the necessary sharpness with the aid of conventional masking and imaging technology. The lack of sharpness of the imaging is due to the fact that, as a result of diffraction effects, regions are also exposed that are supposed to be darkened by the mask.

Diffraction effects occur at all edges between light-transparent and light-opaque regions of the mask. However, the superposition of the diffraction effects in photolithographically critical structures has the effect that regions underneath a light-opaque region are also exposed with exposure radiation. Conventionally, the photoresist that is used has a sensitivity threshold beneath which an effective exposure of the photoresist does not take place. Thus, the diffraction at an edge of the structure represented on the mask has no significant influence on the precision of imaging of the respective structure. Due to the close proximity of two edges in photolithographically critical structures, however, diffraction effects occur, whereby the exposure radiations diffracted under the covered region are superposed on one another, and thus exceed the threshold of exposure sensitivity necessary for the exposure of the photoresist.

In order to avoid this effect, phase masks are used that produce 180°-phase-displaced exposure radiation on the photoresist at adjacent edges having less than a minimum distance from one another. In this way, the diffraction radiations occurring underneath the covering regions of the mask are superposed on one another, and extinguish one another due to the phase displacement.

As shown in FIG. 1c, phase conflicts can occur when the provision of phase shifters that are differently colored (phase-displaced to one another) at both sides of a structure has the result that a further critical structure cannot be surrounded with two different phase shifters. Such a location is identified in FIG. 1c by the circle.

FIG. 1d shows a possible solution of the phase conflict. The possible solution provides the division of a phase shifter 3 into two or more regions that are phase-displaced to one another by 180°. However, such a measure can have the result that further phase conflicts arise, as indicated by the circle. In order to resolve the further phase conflict, it must in turn be provided to divide a further phase shifter 4 into two parts, as shown in FIG. 1b. The dividing line of the two parts of structure 2 to be imaged must thereby be situated opposite the dividing line of previously divided phase shifter 3, so that opposed regions that are phase-shifted to one another arise at all regions. In this way, a boundary line in a phase shifter 3 propagates until a phase shifter is respectively adjacent only to one side of a critical structure.

In order to determine the optimal alternating bright-field phase mask, according to the invention the following method is applied:

In a first method step, the phase-shifting regions are respectively determined at both sides of opaque critical regions provided for the phase mask. Critical regions are thereby defined in that they have less than a predetermined structural width.

Next, in a second method step overlapping regions between rectilinear segments of the critical regions are determined, and end regions of rectilinear segments, ending in the middle of phase-shifting regions or of regions of interaction between phase-shifting regions, of the critical regions are determined, and degenerate critical regions are generated. The latter are obtained by subtracting overlapping regions from the critical regions.

In a third method step, coherent regions (countries), located outside the phase-shifting regions, regions of interaction, and critical regions, are determined, as are large outer borders of these countries and of the overlapping regions and end regions obtained in the previous, second, method step.

Finally, in a fourth method step, from each of the determined outer borders, the number of segments of contact with the degenerate critical regions is determined, and, if the number is odd, a phase conflict is determined.

In a fifth method step, the phase conflicts are then resolved by determining coherent layout regions and the region borders thereof. Coherent layout regions are thereby defined by the phase-shifting regions, the critical regions, and the regions of interaction, minus overlapping regions representing the end regions and the phase conflicts. In addition, at least one connection path is produced between a large outer border, representing a phase conflict, and either a nearest additional outer region border or an odd number of not-yet-connected large outer borders, which likewise represent phase conflicts. Subsequently, the quantity of produced connection paths is reduced to those in which each phase conflict is contained exactly once. Then those regions (covering regions) of the connection paths are marked that are located over the transparent regions, and, finally, for the phase mask the covering regions are fashioned as boundaries between two different regions of the phase mask to be manufactured, whose phase displacements have a phase difference of $\Delta\Phi=180°$.

Figure 2:
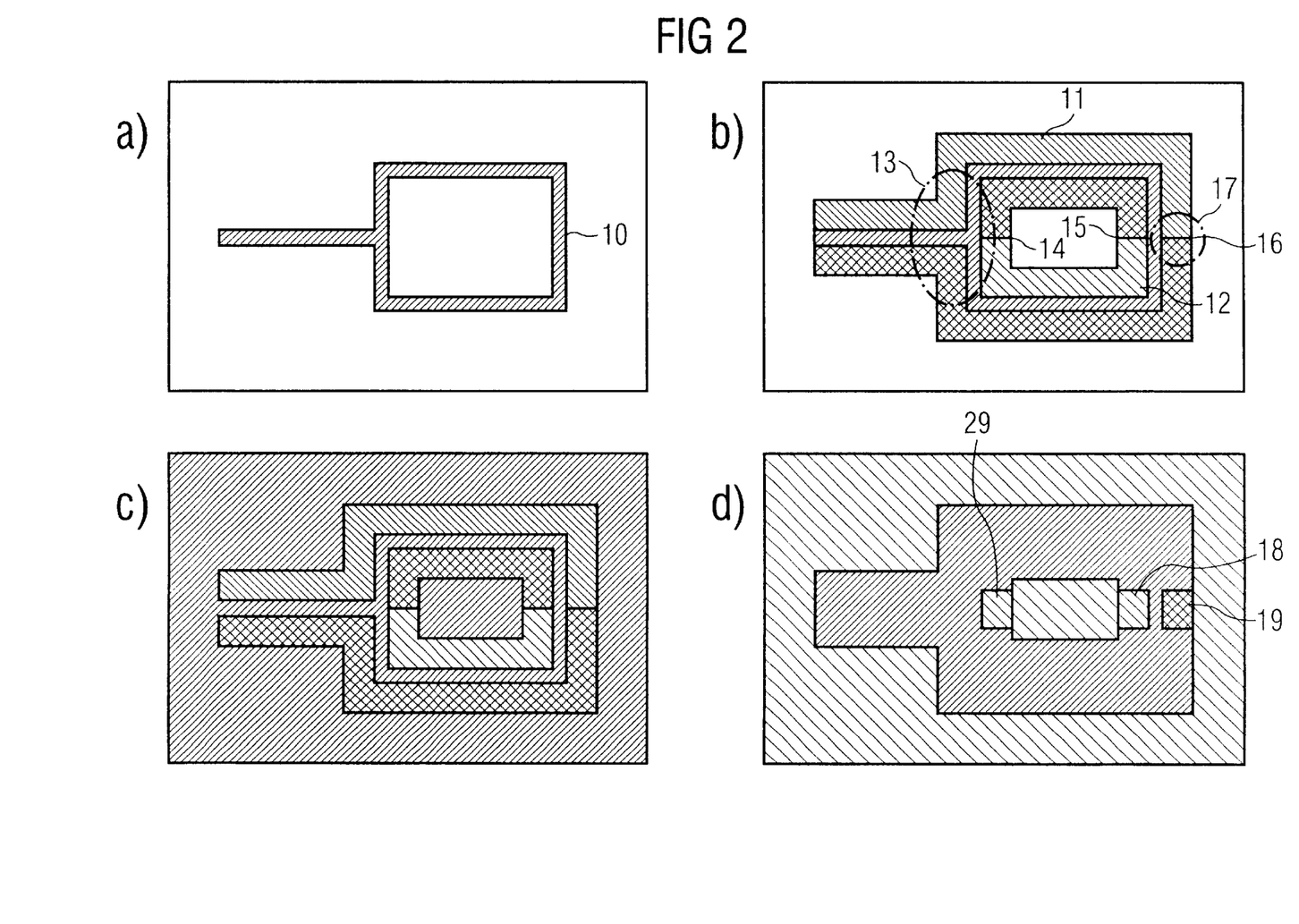
FIG. 2 shows, in four diagrammatic views a)–d), inventively determined masks for the exposure of a photoresist layer in two exposure steps with bright-field phase mask technology, for the example of a layout with a propagating T conflict.

FIGS. 2a–2d show the exposure steps for manufacturing a critical structure 10, as shown in FIG. 2a. Critical structure 10 is for example a loop-shaped printed conductor having critical width. In order to image critical structure 10, an outer phase shifter 11 and an inner phase shifter 12 are provided. For the exact imaging of T-shaped region 13, it is necessary to provide a boundary line 14 in inner phase shifter 12, so that the limb of the T-shaped segment of critical structure 10 can be imaged reliably. The introduction of boundary line 14 requires an additional boundary line 15, which divides phase shifter 12 into two regions. Additional boundary line 15 draws along with it a boundary line 16 situated opposite the structure to the imaged, so that the overall ring structure of critical structure 10 is surrounded both on the inside and on the outside by two phase shifters 11, 12, whereby at each point of the ring structure the phase shifters over the structure are phase-displaced by 180°.

In this way, the phase conflict in region 13, which was triggered by the introduction of boundary line 14, propagates to an additional critical region 17; this is made necessary by the introduction of opposed boundary lines 15, 16. For the imaging of this structure, a first phase mask is provided, as shown in FIG. 2c. The phase mask has regions transparent to light only at the points at which the critical structure 10 is not to be represented. What is concerned is thus a phase mask having phase shifters arranged around the respectively critical structures and having a dark background.

At boundary lines 14, 15, 16, two differently colored parts of phase shifter 11, 12 respectively adjoin one another, effecting an exposure radiation on the photoresist layer that is phase-displaced by 180°. At the boundary line between the phase shifters, a diffraction effect likewise occurs, resulting in a section that is not exposed in this region. However, since this is a section that is not supposed to be fashioned as a printed conductor, the photoresist layer must be exposed at these points at a later time.

For this reason, a second mask, known as a trim mask, is provided, that carries out an exposure at the relevant boundary lines. However, in order not to influence the previously structured regions of the photoresist layer, the trim mask has light-opaque regions at the points at which the phase shifter and the associated critical structures are located. The trim mask for application in the context of bright-field phase mask technology therefore consists of trim structures, a dark region, and an associated bright background, the trim structures being designed, i.e., colored, in such a way that those trim structures located at critical structures overlapped by connection paths have opposed phases for the exposure radiation, whereby a phase displacement of 90° to the bright background is maintained.

At the regions at which propagating boundary lines are located opposite one another with respect to critical structure 10, the distance between the exposure windows provided at the boundary lines by the trim mask is small enough that diffraction effects cannot be disregarded. In the example shown, this is true of boundary lines 15, 16 situated opposite one another, between which region 17 of critical structure 10 is located. In order to avoid diffraction effects in this region, exposure windows 18, 19 provided at the boundary lines are constructed as phase shifters 18, 19 having a mutual phase displacement of 180°. In contrast, an isolated trim opening 29 can be exposed with an arbitrary phase, preferably one of the two phases of exposure windows 18, 19.

Analogous to FIGS. 1a–1d, FIGS. 3a–3d show the propagation of a phase conflict in dark-field phase mask technology. In contrast to FIG. 1, the exposed regions concern structures that are to be processed in a subsequent process. However, not the actual structures, but rather the spacings between the structures, are critical here.

Figure 3:
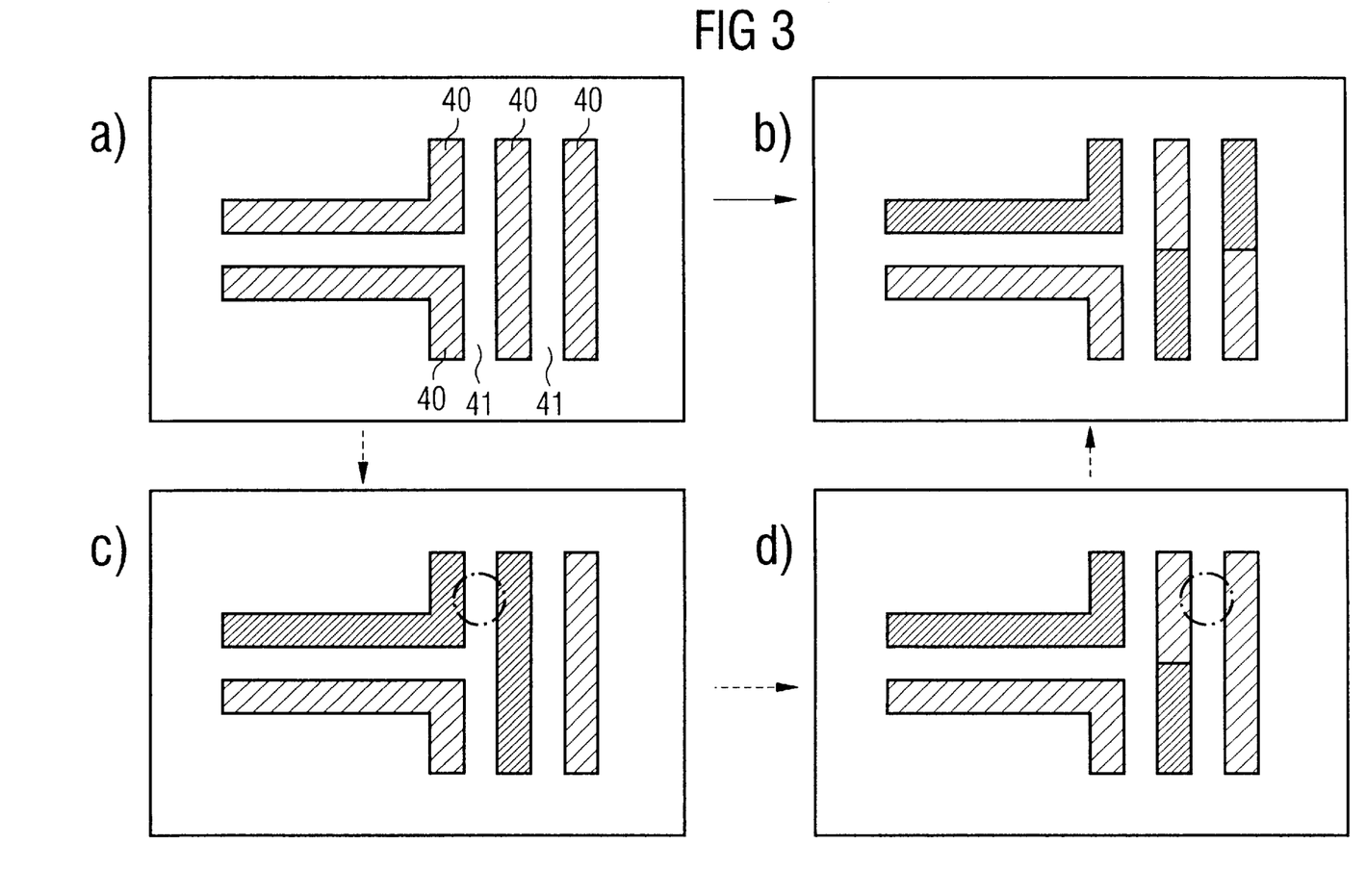
FIG. 3 shows, in four diagrammatic views a)–d), the occurrence of propagating phase conflicts in a dark-field phase mask technology, for the example of a T-printed conductor structure.

Thus, FIG. 3a shows, as examples, printed conductors 40 having critical spacings 41. A photolithographic imaging of this structure with the aid of conventional masking technology leads to diffraction and superposition effects, as a result of which an undesired exposure takes place in the intermediate spaces of the printed conductors. This exposure would have the consequence that short-circuits would arise between the printed conductors, which could result in a failure of the overall circuit. Analogous to the solution of the phase conflicts shown in FIGS. 1a–1d, in dark-field phase mask technology one also obtains phase shifters having phase jumps, which however image the printed conductors. Given propagating phase jumps, one proceeds, as shown in FIG. 1b and as described above, in such a way that regions that are phase-shifted in relation to one another arise at all photolithographically critical structures at the boundary lines.

For the determination of the optimal alternating dark-field phase mask, the following method is applied according to the invention:

In a first method step, critical regions are determined in which two adjacent, transparent regions, provided for the phase mask, have less than a particular determined least distance from one another.

Next, in a second method step overlapping regions are generated between rectilinear segments of the obtained critical regions and end regions of rectilinear segments, ending in the middle of transparent regions, of the critical regions, and degenerate critical regions are generated. The latter are obtained by subtracting overlapping regions from the critical regions.

In a third method step, coherent regions (countries) located outside the transparent regions and the critical regions are then determined, as are large outer borders of the countries, and the overlapping regions and end regions obtained in the previous method step.

Then, in a fourth method step, from each of the determined outer borders the number of segments of contact with the degenerate critical regions is determined, and if the number is odd a phase conflict is determined.

Finally, in a fifth method step the phase conflicts are resolved. Coherent layout regions and the borders thereof are thereby determined, coherent layout regions being defined by the transparent regions and the critical regions located between them, minus regions of overlap representing the end regions and the phase conflicts. Then at least one connection path is produced between a large outer border, representing a phase conflict, and either a nearest additional external region border or an odd number of not-yet-connected large outer borders, which likewise represent phase conflicts. Subsequently, the quantity of produced connection paths is reduced to those in which each phase conflict is contained exactly once. Then those regions (covering regions) of the connection paths are marked that are located over the transparent regions, and, finally, for the phase mask the covering regions are fashioned as boundaries between two different regions of the phase mask to be manufactured, whose phase displacements have a phase difference of $\Delta\Phi=180°$.

Figure 4:
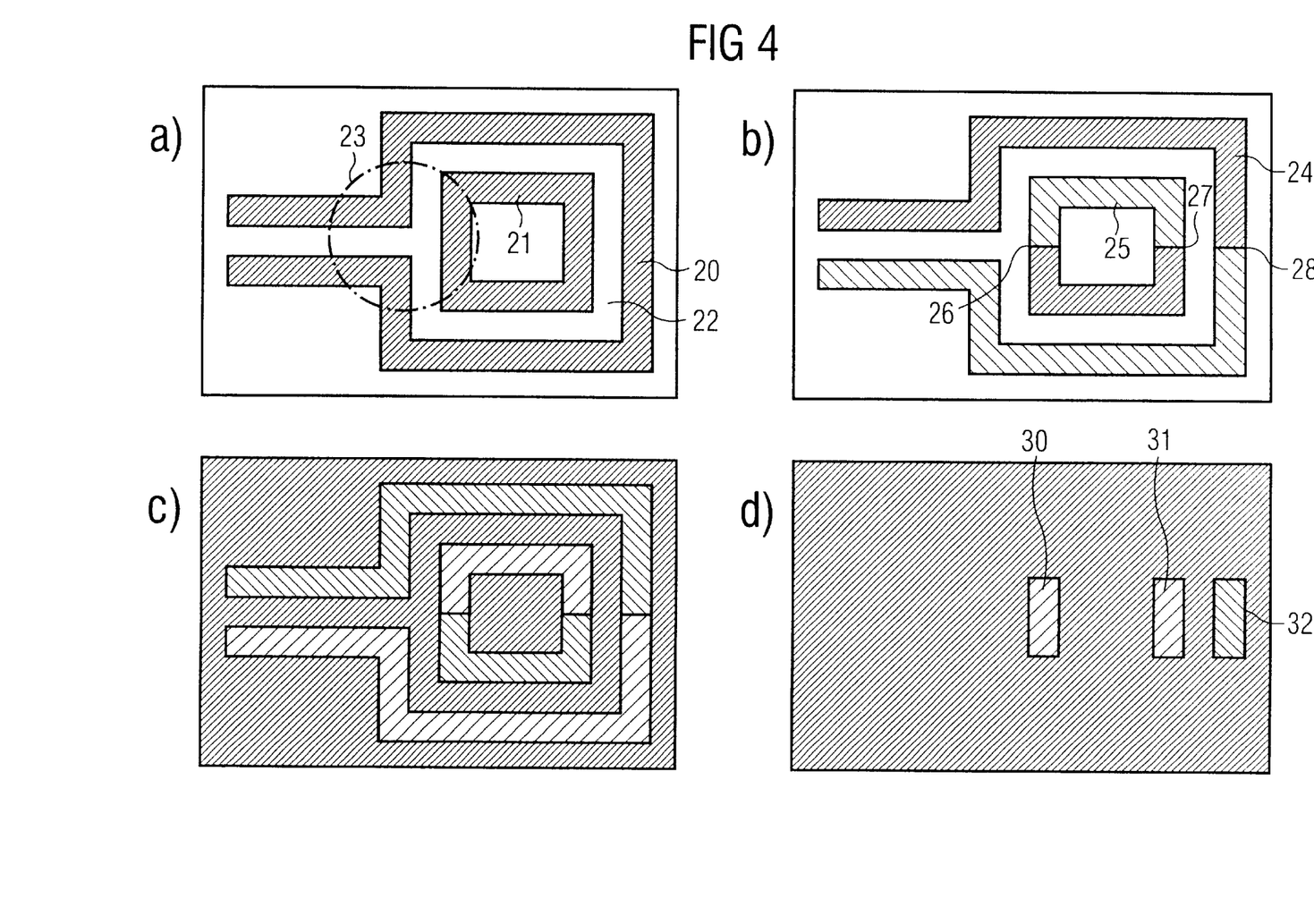
FIG. 4 shows, in four diagrammatic views a)–d), inventively determined masks for the exposure of a photoresist layer with dark-field phase mask technology, for the example of a layout with propagating T-conflict.

FIG. 4a shows a critical structure that is to be imaged. Between first printed conductor 20 and second printed conductor 21, a critical distance region 22 is located that is to be reliably imaged with the aid of dark-field phase mask technology.

First printed conductor 20 is imaged through external phase shifter 24, and second line 21 is imaged through inner phase shifter 25, as shown in FIG. 4b. Due to an occurrent phase conflict in a region 23 identified by a circle, two phase jumps 26, 27 are provided in phase shifter 25. Phase jump 27 is likewise located at a critical structure, so that this phase jump makes necessary the opposed phase jump 28 in first phase shifter 24.

FIG. 4c shows a possible phase mask for use in the first exposure step, in which printed conductors 20, 21 that are to be structured are imaged through light-transparent regions. Here, the phase mask has phase shifters at the light-transparent regions, where photolithographically critical structures are present. In this way, the first phase mask reliably exposes the photoresist layer even at the points at which printed conductors are to be structured whose distance to adjacent printed conductors is critical.

An inventive trim mask for use in the context of dark-field phase mask technology is then made up of trim structures, a bright region, and an associated dark background, the trim structures being designed, i.e., colored, in such a way that those trim structures located at critical structures overlapped by connection paths receive opposed phases for the exposure radiation.

In FIG. 4d, such an inventive trim mask is shown that contains light-transparent exposure windows 30, 31, 32. Exposure windows 30, 31, 32 expose at a later time the points that were not exposed due to the phase jumps of phase shifters 24, 25. Exposure windows 31, 32 are thereby constructed as phase shifters having a mutual phase displacement of 180°. Isolated exposure window 30 can, in contrast, be exposed with an arbitrary phase, preferably one of the two phases of exposure windows 31, 32. In addition, the trim mask there has regions that are transparent to light, which are necessary for the structuring of the structures that are uncritical with respect to diffraction effects.

The present invention therefore enables a double exposure technique for the automatic handling of arbitrary layouts in phase mask technology. The mask for the second exposure process is thereby likewise a phase mask. This enables the handling of propagating phase conflicts. Both masks are preferably automatically generated from the phase-shifting elements, the structures, with the formalism presented above for bright-field or dark-field phase mask technology for the automatic removal of phase conflicts.

The features of the invention disclosed in the preceding specification, the claims, and the drawing can be essential for the realization of the invention in its various constructions, both individually and also in arbitrary combination.

We claim:

1. A method for exposing a photoresist layer on a substrate wafer, which comprises the following method steps:

in a first exposure step, exposing the photoresist layer in first sections with a first exposure radiation and in second sections with a second exposure radiation, the first exposure radiation being phase-displaced by 180° relative to the second exposure radiation, and the first and second sections adjoining one another in boundary regions that are not sufficiently exposed;

determining first and second boundary regions respectively having less than a given predetermined least distance from one another; and in a second exposure step, reexposing the photoresist layer in the first boundary region with a third exposure radiation, and in the second boundary region with a fourth exposure radiation, the third exposure radiation being phase-displaced by 180° relative to the fourth exposure radiation.

2. The method according to claim 1, wherein the first and second boundary regions produced in the first exposure step are spaced by less than a least distance, defined by a reciprocal value of a resolution capacity of an imaging system used for the exposure, in relation to a wavelength of the exposure radiation.

3. The method according to claim 1, which comprises carrying out the first exposure step and the second exposure step with a phase mask.

4. The method according to claim 3, wherein the photoresist layer is suitable for resolving out unexposed regions in a development step, and the method comprises defining a phase mask for at least one of the exposure steps with the following method steps:

(a) determining photolithographically critical regions, in which two adjacent transparent regions, provided for phase shift masking, are spaced by less than the given predetermined least distance from one another;

(b) determining overlapping regions between rectilinear segments of the critical regions and of end regions of rectilinear segments, ending in a middle of transparent regions, of the critical regions, and determining degenerate critical regions through subtraction of the overlapping regions from the critical regions;

(c) determining coherent regions located outside the transparent and the critical regions, of large outer borders of the coherent regions, and of overlapping regions and end regions obtained in step;

(d) determining a number of contact segments with the degenerate critical regions of each of the determined outer borders, of each coherent region, of each overlapping region, and of each end region;

(e) determining whether an odd number of contact segments is present, by which phase conflicts are triggered, by determining coherent layout regions and the borders thereof, wherein coherent layout regions are defined by the transparent regions and the critical regions located therebetween, minus overlapping regions representing the end regions and the phase conflicts, and wherein at least one connection path is produced between a large outer border, representing a phase conflict, and either a nearest further external region border or an odd number of not-yet-connected large outer borders likewise representing phase conflicts, and the quantity of produced connection paths is reduced to those in which each phase conflict is contained exactly once, and covering regions of the connection paths are marked that are located over the transparent regions, and for the phase shift mask the covering regions are fashioned as boundaries between two different regions of the phase mask to be manufactured, whose phase displacements have a phase difference of $\Delta\Phi=180°$.

5. The method according to claim 3, wherein the photoresist layer is suitable for resolving out unexposed regions in a development step, and the method comprises defining a phase mask for at least one of the exposure steps with the following method steps:

(a) determining regions provided for the phase displacement on both sides of opaque critical regions provided for the phase mask, whose width is less than the given predetermined least distance from one another;

(b) determining overlapping regions between rectilinear segments of the critical regions and of end regions of rectilinear segments, ending in the middle of opaque regions, of the critical regions, and determination of degenerate critical regions through subtraction of the overlapping regions from the critical regions;

(c) determining coherent regions located outside the phase-shifting regions, regions of interaction, and the critical regions, of large outer borders of the coherent regions, and of overlapping regions and end regions obtained in step;

(d) determining a number of contact segments with the degenerate critical regions of each of the determined outer borders, of each coherent region, of each overlapping region, and of each end region; and (e) determination of whether an odd number of contact segments is present, by which phase conflicts are triggered, by determining coherent layout regions and the region borders thereof, wherein coherent layout regions are defined by opaque regions and the critical regions located therebetween, minus overlapping regions representing the end regions and the overlapping regions representing phase conflicts, and wherein at least one connection path is produced between a large outer border representing a phase conflict and either a nearest additional external region border or an odd number of not-yet-connected large outer borders that likewise represent phase conflicts, and a quantity of produced connection paths is reduced to those in which each phase conflict is contained exactly once, and covering regions of the connection paths are marked that are located over the phase shifters, and for the phase mask the covering regions are fashioned as boundaries between two different regions of the phase mask to be manufactured whose phase displacements have a phase difference of $\Delta\Phi=180°$.

* * * * *